(12) United States Patent
Toizumi et al.

(10) Patent No.: US 10,712,375 B2
(45) Date of Patent: Jul. 14, 2020

(54) DATA PROCESSING DEVICE, DATA PROCESSING METHOD, AND NON-TRANSITORY STORAGE MEDIUM

(71) Applicant: NEC CORPORATION, Tokyo (JP)

(72) Inventors: Takahiro Toizumi, Tokyo (JP); Eisuke Saneyoshi, Tokyo (JP); Ryota Suzuki, Tokyo (JP); Shigeru Koumoto, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 289 days.

(21) Appl. No.: 15/562,233

(22) PCT Filed: Jan. 8, 2016

(86) PCT No.: PCT/JP2016/050493
§ 371 (c)(1),
(2) Date: Sep. 27, 2017

(87) PCT Pub. No.: WO2016/157926
PCT Pub. Date: Oct. 6, 2016

(65) Prior Publication Data
US 2018/0120363 A1  May 3, 2018

(30) Foreign Application Priority Data
Mar. 31, 2015  (JP) .................................. 2015-071069

(51) Int. Cl.
*G06F 11/30* (2006.01)
*G01R 21/133* (2006.01)

(52) U.S. Cl.
CPC .................................. *G01R 21/133* (2013.01)

(58) Field of Classification Search
CPC ...................................................... G01R 21/133
See application file for complete search history.

(56) References Cited

FOREIGN PATENT DOCUMENTS

| JP | 2002-152971 A | | 5/2002 |
|---|---|---|---|
| JP | 2002152971 | * | 5/2002 |
| JP | 3403368 B2 | | 5/2003 |
| WO | 2015/008645 A1 | | 7/2014 |

OTHER PUBLICATIONS

International Search Report for PCT/JP2016/050493 dated Mar. 22, 2016.

* cited by examiner

*Primary Examiner* — Phuong Huynh
(74) *Attorney, Agent, or Firm* — Sughrue Mion, PLLC

(57) ABSTRACT

In order to solve the above-described problem, there is provided a data processing device (1) including a measurement data acquisition unit (10) that acquires measurement data indicating a temporal change in at least one of current consumption and power consumption of an electrical apparatus, a fluctuation component extraction unit (20) that extracts a fluctuation component related to fluctuation in the current consumption and a fluctuation component related to fluctuation in the power consumption from the measurement data, and a feature value acquisition unit (30) that acquires a feature value of the fluctuation component.

11 Claims, 15 Drawing Sheets

FIG. 8

| TIME | POWER CONSUMPTION | OPERATIONAL STATUS GROUP | FLUCTUATION STATUS GROUP |
|---|---|---|---|
| 8:00:00 | .... | 0 | |
| 8:00:15 | .... | 0 | |
| 8:00:30 | .... | 0 | |
| ⋮ | ⋮ | ⋮ | ⋮ |
| 8:30:00 | .... | 2 | ✔ |
| 8:30:15 | .... | 2 | ✔ |
| ⋮ | ⋮ | ⋮ | ⋮ |

FIG. 12

| FEATURE VALUE | OPERATIONAL STATUS |
|---|---|
| ⋮ | ⋮ |

DATA PROCESSING DEVICE, DATA PROCESSING METHOD, AND NON-TRANSITORY STORAGE MEDIUM

CROSS REFERENCE TO RELATED APPLICATIONS

This application is a National Stage of International Application No. PCT/JP2016/050493 filed Jan. 8, 2016, claiming priority based on Japanese Patent Application No. 2015-071069 filed Mar. 31, 2015, the contents of all of which are incorporated herein by reference in their entirety.

TECHNICAL FIELD

The present invention relates to a data processing device, a data processing method, and a program.

BACKGROUND ART

Operational status (ON/OFF, power consumption, and the like) of an individual electrical apparatus can be simply recognized by mounting a measuring device to a power supply of each apparatus. However, there is a problem of a burden imposed on a user due to labor and time required for the installation thereof or a problem of the required cost of the measuring device.

A method disclosed in Patent Document 1 can be given as a means for solving such a problem. In this method, an operational status of an individual electrical apparatus is inferred using information regarding a voltage and a current which are measured in the vicinity of a power feed inlet. According to this method, it is possible to reduce a burden on a user and cost, as compared to a method of mounting a power measuring device to every apparatus.

RELATED DOCUMENT

Patent Document

[Patent Document 1] Japanese Patent No. 3403368

SUMMARY OF THE INVENTION

Technical Problem

There is an electrical apparatus of which the current consumption and the power consumption may fluctuate out of a predetermined range within a short period of time during the operation of the electrical apparatus. For example, an electrical apparatus such as a notebook PC which includes an inverter, and the like correspond thereto. In the notebook PC, the current consumption and the power consumption fluctuate out of a predetermined range within a short period of time in accordance with, for example, the usage rate of a CPU, and the like.

In a case of the technique disclosed in Patent Document 1, it is necessary to prepare training data of plural current waveforms having different shapes or amplitudes with respect to such fluctuation, and unless the measurement data measured in the vicinity of a power feed inlet, and the like are processed after the training data is prepared so as to sufficiently cover the fluctuation, there may be a problem of the deteriorated accuracy of inference.

An object of the invention is to provide a new technique for inferring an operational status of an electrical apparatus.

Solution to Problem

According to the invention, there is provided a data processing device including a measurement data acquisition unit that acquires measurement data indicating a temporal change in at least one of current consumption and power consumption of an electrical apparatus, a fluctuation component extraction unit that extracts a fluctuation component related to fluctuation in the current consumption and a fluctuation component related to fluctuation in the power consumption from the measurement data, and a feature value acquisition unit that acquires a feature value of the fluctuation component.

In addition, according to the invention, there is provided a data processing device including a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, and an inference unit that infers an operational status of the electrical apparatus on the basis of the training data.

In addition, according to the invention, there is provided a data processing method including causing a computer to execute a measurement data acquisition step of acquiring measurement data indicating a temporal change in at least one of current consumption and power consumption of an electrical apparatus, a fluctuation component extraction step of extracting a fluctuation component related to fluctuation in the current consumption and a fluctuation component related to fluctuation in the power consumption from the measurement data, and a feature value acquisition step of acquiring a feature value of the fluctuation component.

In addition, according to the invention, there is provided a data processing method executed by a computer storing in advance a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, the method including an inference step of inferring an operational status of the electrical apparatus on the basis of the training data.

In addition, according to the invention, there is provided a program causing a computer to function as a measurement data acquisition unit that acquires measurement data indicating a temporal change in at least one of current consumption and power consumption of an electrical apparatus, a fluctuation component extraction unit that extracts a fluctuation component related to fluctuation in the current consumption and a fluctuation component related to fluctuation in the power consumption from the measurement data, and a feature value acquisition unit that acquires a feature value of the fluctuation component.

In addition, according to the invention, there is provided a program causing a computer to function as a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, and an inference unit that infers an operational status of the electrical apparatus on the basis of the training data.

Advantageous Effects of Invention

According to the invention, a new technique for inferring an operational status of an electrical apparatus is realized.

BRIEF DESCRIPTION OF THE DRAWINGS

The above-described objects, other objects, features and advantages will be further apparent from the preferred exemplary embodiments described below, and the accompanying drawings as follows.

FIG. 8 is a schematic diagram illustrating an example of information summarizing results of grouping of measurement data.

FIG. 12 is a schematic diagram illustrating an example of training data according to the exemplary embodiment.

DESCRIPTION OF EXEMPLARY EMBODIMENTS

First, an example of a hardware configuration of a device according to the exemplary embodiment will be described. Units included in the device according to the exemplary embodiment are realized by any combination of hardware and software on the basis of a central processing unit (CPU), a memory, a program loaded into the memory, a storage unit (can also store not only a program which has been stored in advance from the stage of shipping out the device but also a program which is downloaded from a storage medium such as a compact disc (CD), or a server or the like on the Internet) such as a hard disk which stores the program, and an interface for network connection of an arbitrary computer. In addition, those skilled in the art can understand that various modification examples can be made to the realization method and the device.

Figure 1:
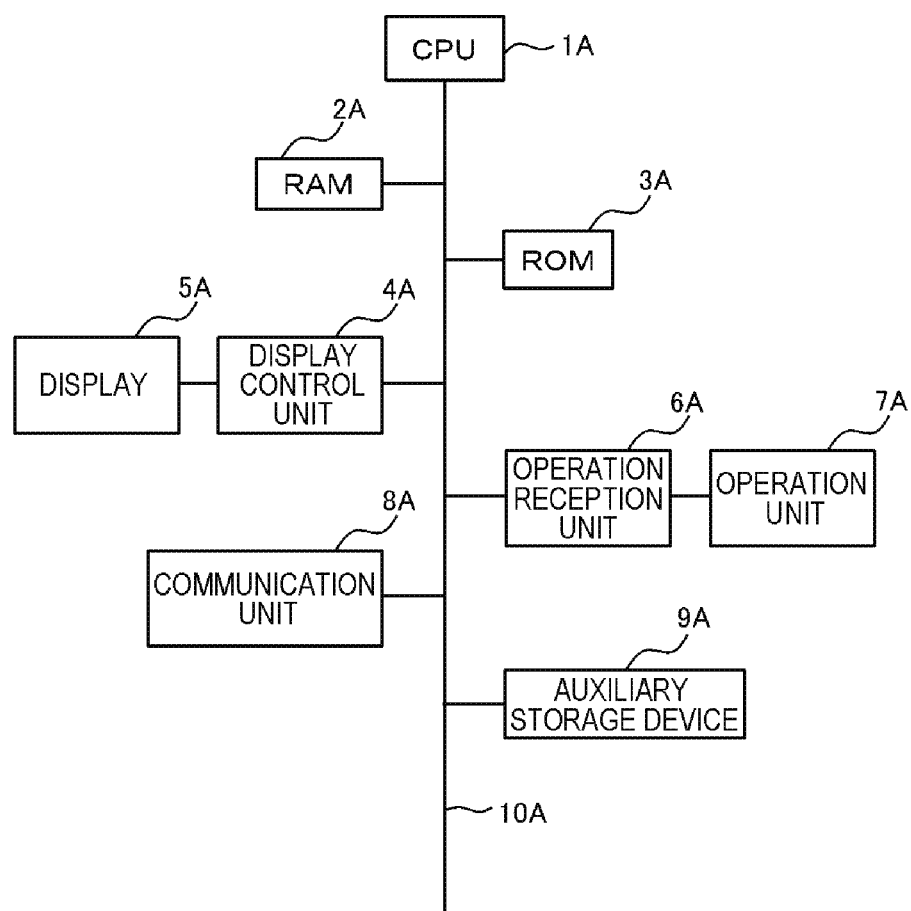
FIG. 1 is a conceptual diagram illustrating an example of a hardware configuration of a device according to the exemplary embodiment.

FIG. 1 is a conceptual diagram illustrating an example of a hardware configuration of the device according to the exemplary embodiment. As illustrated in the drawing, the device according to the exemplary embodiment includes, for example, a CPU 1A, a random access memory (RAM) 2A, a read only memory (ROM) 3A, a display control unit 4A, a display 5A, an operation reception unit 6A, an operation unit 7A, a communication unit 8A, an auxiliary storage device 9A, and the like that are connected to each other by a bus 10A. Note that, although not shown in the drawing, the device may further include other components such as an input and output interface, a microphone, and a speaker which are connected to an external apparatus in a wired manner.

The CPU 1A controls the overall computer of the device together with each component. The ROM 3A includes an area in which programs for operating the computer, various application programs, various pieces of setting data used during the operation of the programs, and the like are stored. The RAM 2A includes an area, such as a work area for the operation of the programs, which transitorily stores data. The auxiliary storage device 9A is, for example, a hard disc drive (HDD), and can store large-capacity data.

The display 5A is, for example, a display device (a light emitting diode (LED) displayer, a liquid crystal display, an organic electro luminescence (EL) display, or the like). The display 5A may be a touch panel display integrated with a touch pad. The display control unit 4A reads data stored in a video RAM (VRAM), performs predetermined process on the read data, and transmits the processed data to the display 5A, thereby performing various screen displays. The operation reception unit 6A receives various operations through the operation unit 7A. The operation unit 7A includes an operation key, an operation button, a switch, a jog dial, a touch panel display, a keyboard, and the like. The communication unit 8A is connected to a network, such as the Internet or a local area network (LAN), in a wired and/or wireless manner to communicate with other electronic apparatuses.

Hereinafter, the exemplary embodiment will be described. Note that, functional block diagrams used in describing the following exemplary embodiment show function-based blocks rather than hardware-based configurations. In the functional block diagrams, although a description is given such that each device is realized by one apparatus, the realization means therefor is not limited thereto. In other words, each device may be configured to be physically or logically separated. Note that the same components will be denoted by the same reference numerals and signs, and a description thereof will not be repeated.

First Exemplary Embodiment

A data processing device 1 according to this exemplary embodiment can acquire a feature value related to fluctuation in current consumption and power consumption of an electrical apparatus (for example, an electrical apparatus including an inverter) of which the current consumption and the power consumption may fluctuate out of a predetermined range within a short period of time during the operation of the electrical apparatus. Hereinafter, a description thereof will be given in detail.

Figure 2:
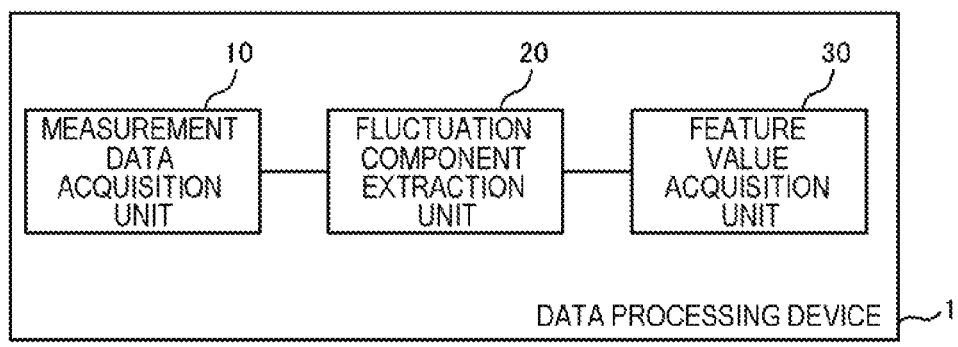
FIG. 2 illustrates an example of a functional block diagram of a data processing device according to the exemplary embodiment.

First, a configuration of the data processing device 1 according to this exemplary embodiment will be described in detail. FIG. 2 illustrates an example of a functional block diagram of the data processing device 1 according to this exemplary embodiment. As illustrated in the drawing, the data processing device 1 includes a measurement data acquisition unit 10, a fluctuation component extraction unit 20, and a feature value acquisition unit 30.

The measurement data acquisition unit 10 acquires measurement data indicating temporal changes in at least one of current consumption and power consumption of an electrical apparatus. The measurement data may include only components of one electrical apparatus, or may include components of plural electrical apparatuses. In the latter case, the components of the plural electrical apparatuses may simultaneously appear.

For example, a measurement device may be provided in the vicinity of equipment such as a main power supply, a power feed (power supply) inlet, a distribution board, or an electrical outlet which is provided in a facility (for example, home, an office, a store, and the like) of each power consumer. The measurement data acquisition unit 10 may acquire, for each power consumer, measurement data measured by the measurement device in the consumer's daily life. In this manner, measurement data acquired with respect to each power consumer includes components (current consumption and power consumption) of an electrical apparatus which is used by the power consumer in the power consumer's facility. In addition, measurement data indicating usage patterns of plural electrical apparatuses used by each power consumer is obtained. The usage patterns of the plural electrical apparatuses mean combination patterns of the electrical apparatuses such as "electrical apparatus A that may be singly used" and "electrical apparatus A and electrical apparatus B that may be simultaneously used".

The data processing device 1 may be provided inside a facility of each power consumer. The measurement data acquisition unit 10 may acquire measurement data from the measurement device by using any communication unit based on a wired and/or wireless method. In addition, the data processing device 1 may be provided on a network such as the Internet (for example, a cloud server). In this case, the facility of each power consumer includes a transmission device that transmits the measurement data measured by the measurement device to the data processing device 1. The measurement data acquisition unit 10 receives the measurement data transmitted by the transmission device.

Figure 3:
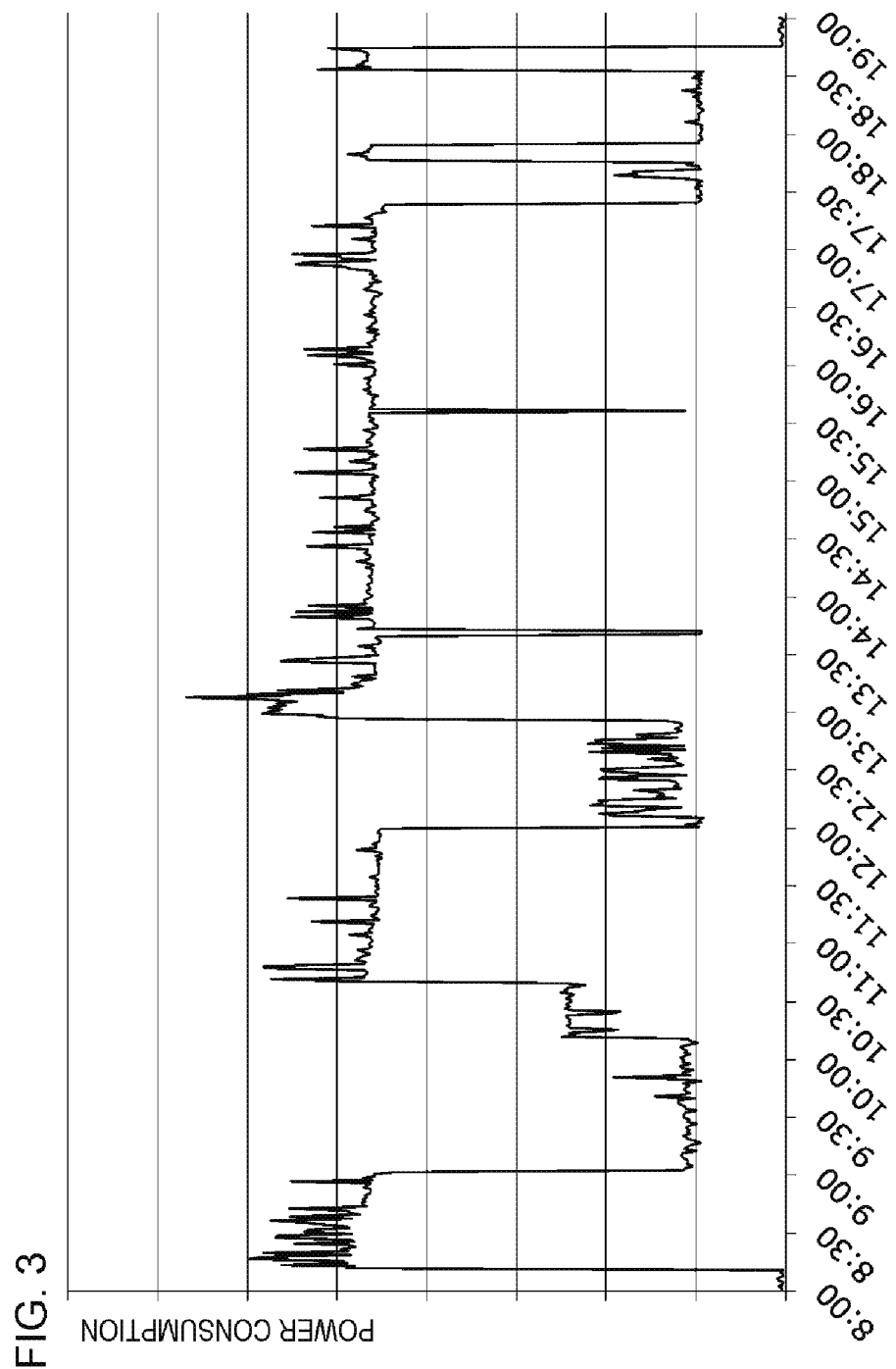
FIG. 3 is a diagram illustrating an example of measurement data according to the exemplary embodiment.

FIG. 3 illustrates an example of measurement data acquired by the measurement data acquisition unit 10. FIG. 3 illustrates measurement data indicating temporal changes in power consumption between 8:00 and 19:00 in a certain day.

Referring back to FIG. 2, the fluctuation component extraction unit 20 extracts, from measurement data, a fluctuation component related to fluctuation of the electrical apparatus of which the current consumption and the power consumption may fluctuate during the operation of the electrical apparatus. The wording "fluctuation" in this exemplary embodiment means fluctuation in current consumption and power consumption out of a predetermined range within a short period of time (for example, several seconds or several minutes) (for example, a difference between a maximum value and a minimum value within the period of time is equal to or greater than 50 mA and equal to or greater than 5 W). The fluctuation out of a predetermined range may appear regularly or irregularly. A minute fluctuation due to a measurement error or a change in surrounding environment is not included in the "fluctuation" in this exemplary embodiment. Hereinafter, the above-mentioned fluctuation according to this exemplary embodiment may be referred to as "the fluctuation". The "predetermined range" in the definition of the fluctuation may be a constant multiple of $\Delta P$ to be described below with reference to FIG. 6.

The wording "may fluctuate" means that the fluctuation occurs due to design of the electrical apparatus, but does not necessarily always occur. The fluctuation occurs intermittently. That is, a time slot in which the fluctuation occurs and a time slot in which the fluctuation does not occur are present together during the operation of the electrical apparatus. The fluctuation is also caused by, for example, an inverter or the like. For example, in a case of a notebook PC including an inverter, the fluctuation occurs depending on fluctuation in the usage rate of a CPU. On the other hand, in a case where the usage rate of the CPU is constant, the fluctuation does not occur.

Current consumption and power consumption fluctuate during the occurrence of the fluctuation. That is, the current consumption and the power consumption have various values during the occurrence of the fluctuation. On the other hand, the current consumption and the power consumption do not fluctuate while the fluctuation does not occur. That is, the current consumption and the power consumption have a substantially constant value while the fluctuation does not occur.

Thus, in measurement data of current consumption and power consumption, the frequency of appearance (appearance frequency) of each value when the fluctuation does not occur is higher than the frequency of appearance (appearance frequency) of each value when the fluctuation occurs. The fluctuation component extraction unit 20 extracts a fluctuation component from the measurement data by using such features.

Figure 4:
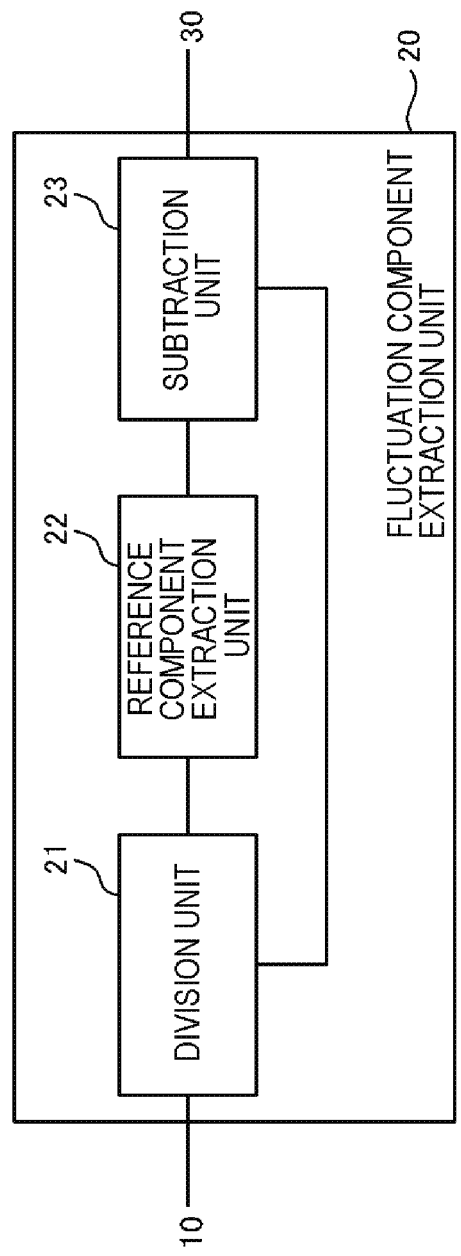
FIG. 4 illustrates an example of a functional block diagram of a fluctuation component extraction unit according to the exemplary embodiment.

FIG. 4 illustrates an example of a functional block diagram of the fluctuation component extraction unit 20. As illustrated in the drawing, the fluctuation component extraction unit 20 includes a division unit 21, a reference component extraction unit 22, and a subtraction unit 23.

The division unit 21 divides the measurement data into a fluctuation-occurring group and a non-fluctuation-occurring group, on the basis the frequency of appearance of the values. The division unit 21 classifies values having relatively high frequency of appearance as the non-fluctuation-occurring group.

For example, the division unit 21 may classify values having relatively high frequency of appearance and values in the vicinity thereof as the non-fluctuation-occurring group. The division unit 21 may classify the other values as the fluctuation-occurring group.

Figure 5:
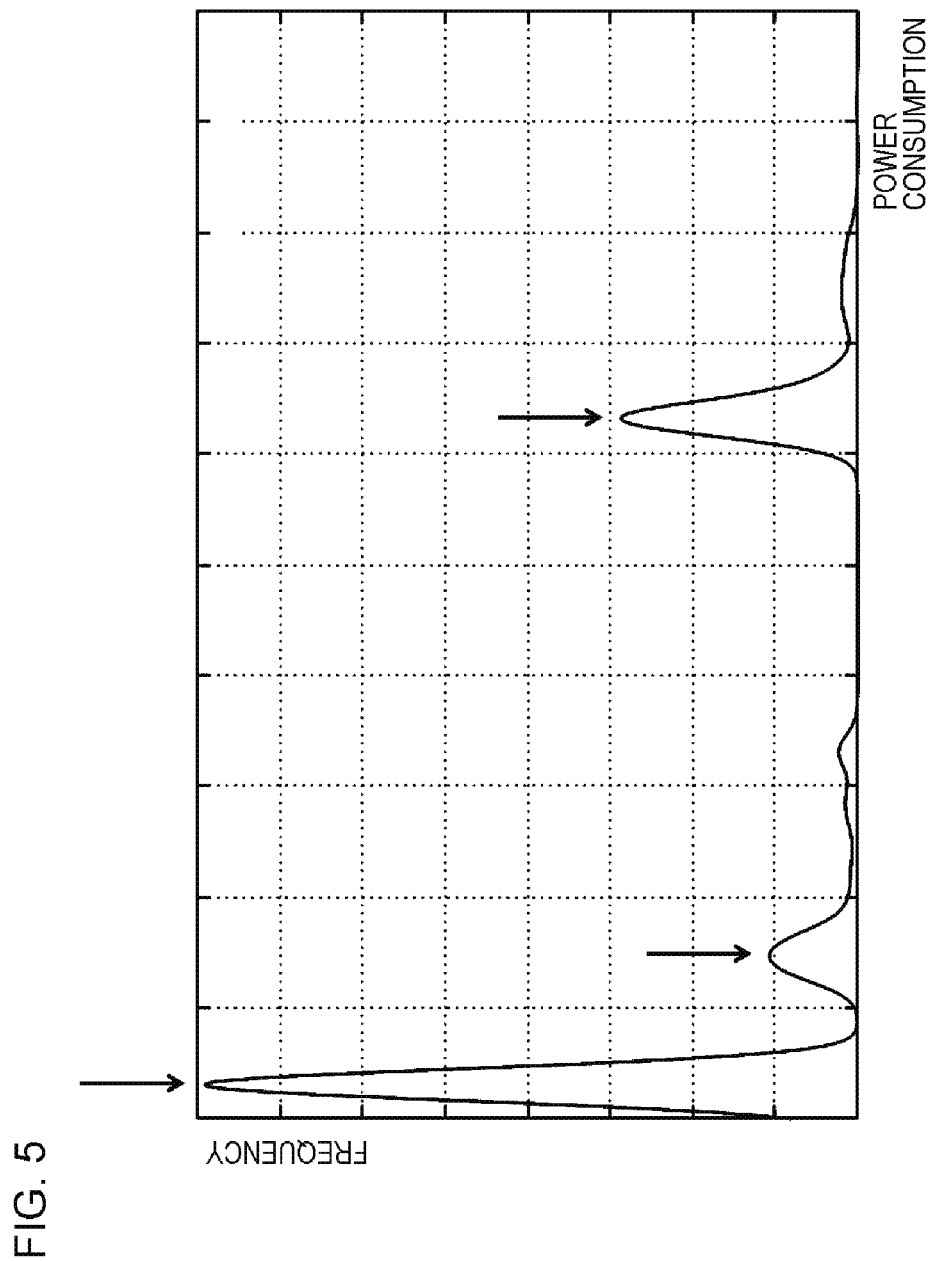
FIG. 5 is a diagram illustrating an example of frequency data according to the exemplary embodiment.

Here, an example of processing performed by the division unit 21 will be described. First, the division unit 21 obtains frequency data as illustrated in FIG. 5 from the measurement data as illustrated in FIG. 3. FIG. 5 illustrates density distribution obtained by applying kernel density estimation of Gaussian kernel to the power consumption data of FIG. 3. Here, the horizontal axis represents power, and the vertical axis represents frequency. Note that, in the example, the density distribution of power consumption is shown in order to facilitate a description, but frequency data of other types of value may be obtained. The other types of values may be, for example, a current, a reference waveform obtained by performing frequency decomposition of a current waveform, the intensity and phase of a harmonic of the current waveform, a power factor, a maximum value of the current waveform, and the like.

After the frequency data as illustrated in FIG. 5 is obtained, the division unit 21 extracts a peak satisfying a predetermined condition from plural peaks appearing in the frequency data. Thereby, a noise component (noise peak) is removed. Note that, the "peak" in this exemplary embodiment indicates the highest point of a curve, that is, a maximal value. In this exemplary embodiment, the front and back slopes of a curve constituted by data located before and after the peak is referred to as a "curve including a peak".

There are various methods of extracting a peak satisfying the predetermined condition, that is, methods of removing a noise component, and a peak by which, for example, a half value width $\Delta P_k$ (P denotes power consumption, and k denotes a peak number) can be calculated may be extracted. That is, a peak by which the half value width $\Delta P_k$ cannot be calculated may be removed as a noise component. For example, a peak range may be determined for each peak, thereby extracting a peak by which the half value width $\Delta P_k$ can be calculated (determined) within the peak range may be extracted. The peak range may be determined on the basis of, for example, a peak value (power consumption). For example, the peak range may be equal to or greater than (peak value $P_k-\alpha_1$) and equal to or less than (peak value $P_k+\alpha_2$).

As another example of a method of extracting a peak satisfying a predetermined condition, a peak having a value (frequency) equal to or greater than a predetermined value may be extracted. In addition, a peak having the width of a curve including the peak at a predetermined height is equal to or less than a predetermined value may be extracted (for example, the width of a curve including a peak at a height of 80% of the height (value (frequency) of the peak) of the peak is equal to or less than the predetermined value). In addition, a predetermined number of peaks may be sequentially extracted in order from the largest value (frequency).

Note that, a combination of "equal to or greater", "equal to or less", and "less" used in showing a predetermined range is a matter of design, and can be changed to any combination of the illustrated ranges. The same premise applies hereinafter.

In a case of the measurement data illustrated in FIG. 3, three peaks indicated by arrows in FIG. 5 are extracted through the above-described processing. The peaks extracted here prominently show features (power consumption in a case of the example of FIG. 5) when the fluctuation does not occur. Note that the features of the extracted plural peaks respectively show operational statuses of different electrical apparatuses. For example, there is a difference between the peaks such as "electrical apparatuses being in operation are different from each other" or "the same electrical apparatuses are operated, but an operational content (a content of processing being performed) of at least one electrical apparatus is different from the other".

Thereafter, the division unit 21 divides the measurement data into groups according to each extracted peak. As described above, the plural peaks respectively correspond to operational statuses of different electrical apparatuses. Here, the wording "division into groups" means that division of the measurement data according to each operational status of the electrical apparatus. In a case where only one peak is extracted, the division into groups mentioned here is not necessary. Division into groups according to each operational status is performed, and thus it is possible to clarify to which operational content each fluctuation component corresponds.

Here, an example of division into groups according to each operational status will be described. For example, division into groups may be performed by defining a range between equal to or greater than (peak value $P_k-\beta_1$) and less than (peak value $P_{k+1}-\beta_2$) as a group corresponding to the peak value $P_k$. In addition, division into groups may be performed by defining a range between equal to or greater than (peak value $P_k-\beta_3$) and less than (peak value $P_k+\beta_4$) as a group corresponding to the peak value $P_k$.

In the former example, with $\beta_1$ defined as a half value width $\Delta P_k$ and $\beta_2$ defined as a half value width $\Delta P_{k+1}$, the division into groups is expressed by the following expression.

$$(P_k - \Delta P_k) \le P < (P_{k+1} - \Delta P_{k+1}) \qquad (1)$$

Figure 6:
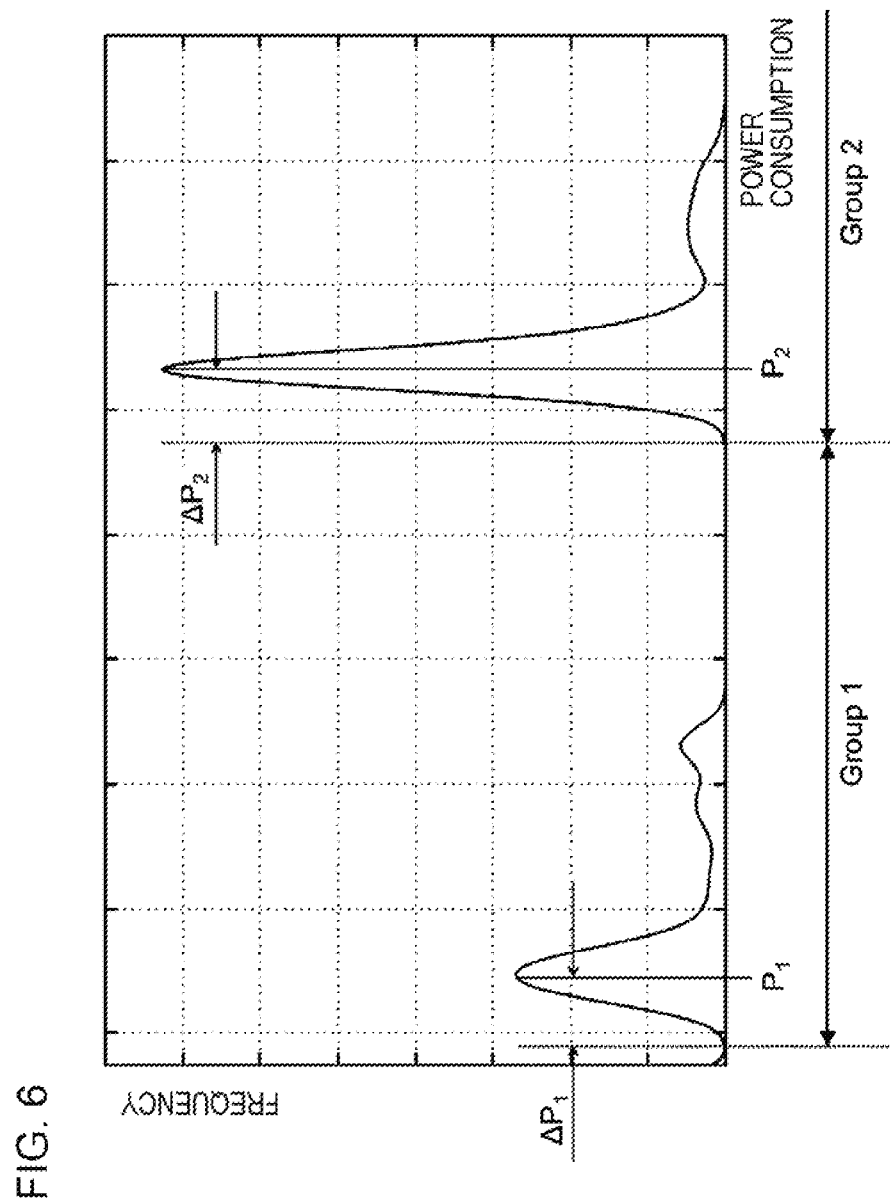
FIG. 6 is a diagram illustrating an example of a process of performing division into operational status groups on the basis of frequency data.
Figure 7:
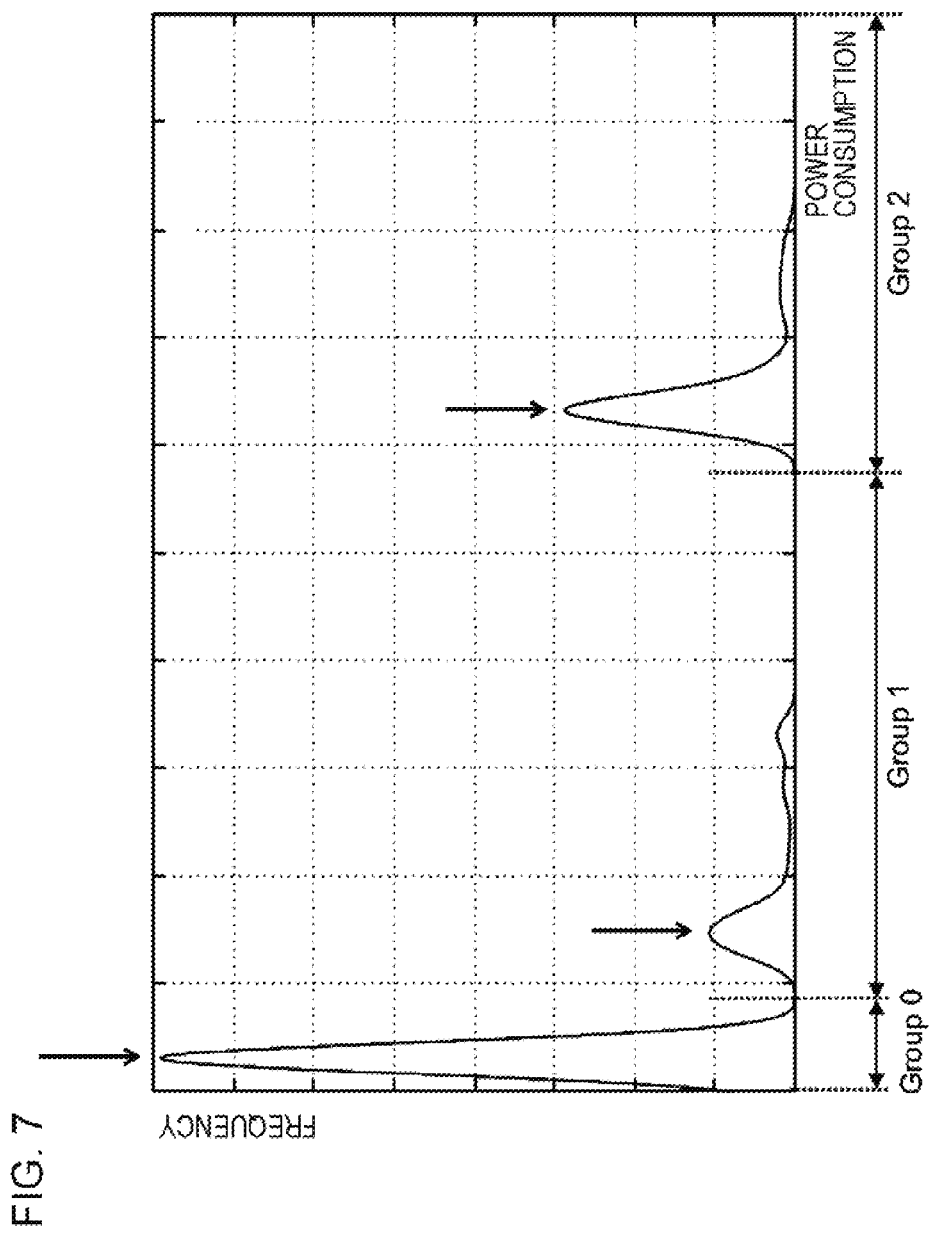
FIG. 7 is a diagram illustrating an example of a process of performing division into operational status groups on the basis of frequency data.

A concept of grouping based on the expression is illustrated in FIG. 6. In FIG. 6, two peaks extracted from the right side in the data of FIG. 5 are illustrated in an enlarged manner, and ranges of groups 1 and 2 corresponding to the respective peaks are illustrated. As seen from the drawing, the group 1 ranges from equal to or greater than (peak value $P_1-\Delta P_1$) to less than (peak value $P_2-\Delta P_2$). When the measurement data of FIG. 3 is grouped in accordance with the rule, division into groups 0 to 2 is performed as illustrated in FIG. 7.

A portion of data illustrated in FIG. 8 is completed by the division into groups. In the data of FIG. 8, measured value (in a case of the drawing, power consumption), results of division into groups based on operational statuses (in a case of the drawing, an operational status group), and results of division into groups based on whether or not the fluctuation has occurred (in a case of the drawing, a fluctuation status group) are associated with information for identifying measurement data (in a case of the drawing, a measurement time). In a case of the example, the measurement data is obtained every 15 seconds, but is not limited thereto.

Results of the division into groups are described in the column of the operational status group. In the example illustrated in the drawing, any one of the groups 0 to 2 is associated with each measurement data. Note that the column of the fluctuation status group is described after the following processing is performed. Hereinafter, a group (in a case of the example of FIG. 7, groups 0 to 2) based on an operational status will be referred to as an operational status group.

After the division into groups is performed, the division unit 21 divides measurement data into a fluctuation-occurring group and a non-fluctuation-occurring group for each operational status group.

The division unit 21 sets measurement data included in a range between equal to or greater than (peak value $P_k-\gamma_1$) and equal to or less than (peak value $P_k+\gamma_2$) to be the non-fluctuation-occurring group, and sets the other pieces of measurement data to be the fluctuation-occurring group. For example, the value of $\Delta P_k$ may be used as the values of $\gamma_1$ and $\gamma_2$. Thereby, the column of the fluctuation status group illustrated in FIG. 8 is filled. In the drawing, a flag (in a case of the drawing, a check mark) is set in data belonging to a fluctuation-occurring group.

Thus, the division unit 21 can group measurement data for each operational status of the electrical apparatus. The division unit 21 can divide measurement data into a fluctuation-occurring group and a non-fluctuation-occurring group, for each operational status group.

Note that, in the above description, kernel density inference of Gaussian kernel and the use of conditions using the half value width $\Delta P_k$ are described as a method of extracting a peak from measurement data, but any of other methods may be used as long as the method is a method for extracting a portion having high data density.

In addition, the division unit 21 can perform a process of extracting the fluctuation component by using measurement data over any length as an object to be processed. For example, the division unit 21 may use the entire measurement data acquired from the measurement data acquisition unit 10 as an object to be processed, may use a portion of time-series data in a certain time range which is cut out from the entire acquired time-series data as an object to be processed, or may perform scanning of the entire time-series data while shifting a time range little by little like moving average (sequentially set the data to be an object to be processed).

Referring back to FIG. 4, the reference component extraction unit 22 extracts components of measurement data of the non-fluctuation-occurring group as reference components for each operational status group (in a case of the example of FIG. 7, groups 0 to 2). For example, the reference component extraction unit 22 can specify measurement data belonging to the non-fluctuation-occurring group for each operational status group, on the basis of the data illustrated in FIG. 8. The reference components to be extracted may be a current waveform, a reference waveform and a waveform of a harmonic obtained by performing frequency decomposition of the current waveform, a power waveform, a reference waveform of the power waveform, and a waveform of a harmonic of the power waveform, temporal changes in a power factor, and the like. However, it is preferable to set a current waveform as a reference component and a fluctuation component to acquire a feature value from the fluctuation component. The reason will be described below.

Note that small variations caused by a measurement error and the like may be present in plural pieces of measurement data included in the non-fluctuation-occurring group. The reference component extraction unit 22 can obtain one reference component by extracting plural reference components (for example, current waveforms) from the plural pieces of measurement data and then averaging the extracted reference components. The reference component extraction unit 22 can set the obtained reference component (for example, a current waveform) to be a reference component of the operational status group.

The subtraction unit 23 subtracts the reference component from components of measurement data of the fluctuation-occurring group for each operational status group (in a case of the example of FIG. 7, the groups 0 to 2) to thereby extract a fluctuation component. The types of components and fluctuation component of the measurement data are the same as the type of reference component.

The fluctuation appears in the form in which current consumption and power consumption fluctuate, within a short period of time from a state in which the fluctuation does not occurred, out of a predetermined range (for example, a difference between a maximum value and a minimum value within the period of time (for example, several seconds or several minutes) is equal to or greater than 50 mA and equal to or greater than 5 W). Thus, a component (reference component) when the fluctuation does not occur and a component of the fluctuation (fluctuation component) are included in the measurement data of the fluctuation-occurring group. Therefore, the fluctuation component is obtained by subtracting the reference component from the component (reference component+fluctuation component) of the measurement data of the fluctuation-occurring group.

Referring back to FIG. 2, the feature value acquisition unit 30 acquires a feature value of the fluctuation component extracted by the fluctuation component extraction unit 20 for each operational status group. For example, the feature value acquisition unit 30 may acquire the above-mentioned fluctuation component itself as a feature value. In addition, the feature value acquisition unit 30 may acquire predetermined feature values (for example, features of the shape of a waveform, a phase difference between a reference wave and a harmonic, a difference in current value, a difference in power, and the like) from the above-mentioned fluctuation component.

Thus, the feature values of the fluctuation component included in the measurement data acquired by the measurement data acquisition unit 10 can be acquired for each operational status of the electrical apparatus.

Note that, in a case of this exemplary embodiment, it is preferable that the fluctuation component extraction unit 20 sets a current waveform of which the phase is aligned with the phase of a voltage waveform, to be a fluctuation component. It is preferable that the feature value acquisition unit 30 acquires a feature value of the shape of the current waveform as a feature value of a fluctuation component. Hereinafter, the reason will be described.

The inventors have newly found that the values of power, a current, and a power factor, and the like fluctuate when the fluctuation occurs, while the shape of a current waveform does not change. That is, the values of power, a current, and a power factor, and the like fluctuate in accordance with the state (for example, the usage rate of a CPU, or the like) of the fluctuation, while the shape of the current waveform is fixed regardless of the state of the fluctuation (for example, the usage rate of a CPU, or the like).

The inventors have further newly found that the shape of a current waveform is peculiar to each electrical apparatus (for example, a shape depending on the type of inverter).

Thus, the shapes of the current waveforms extracted as fluctuation components are the same as each other within the same operational status group, and are peculiar to each operational status group.

Figure 9:
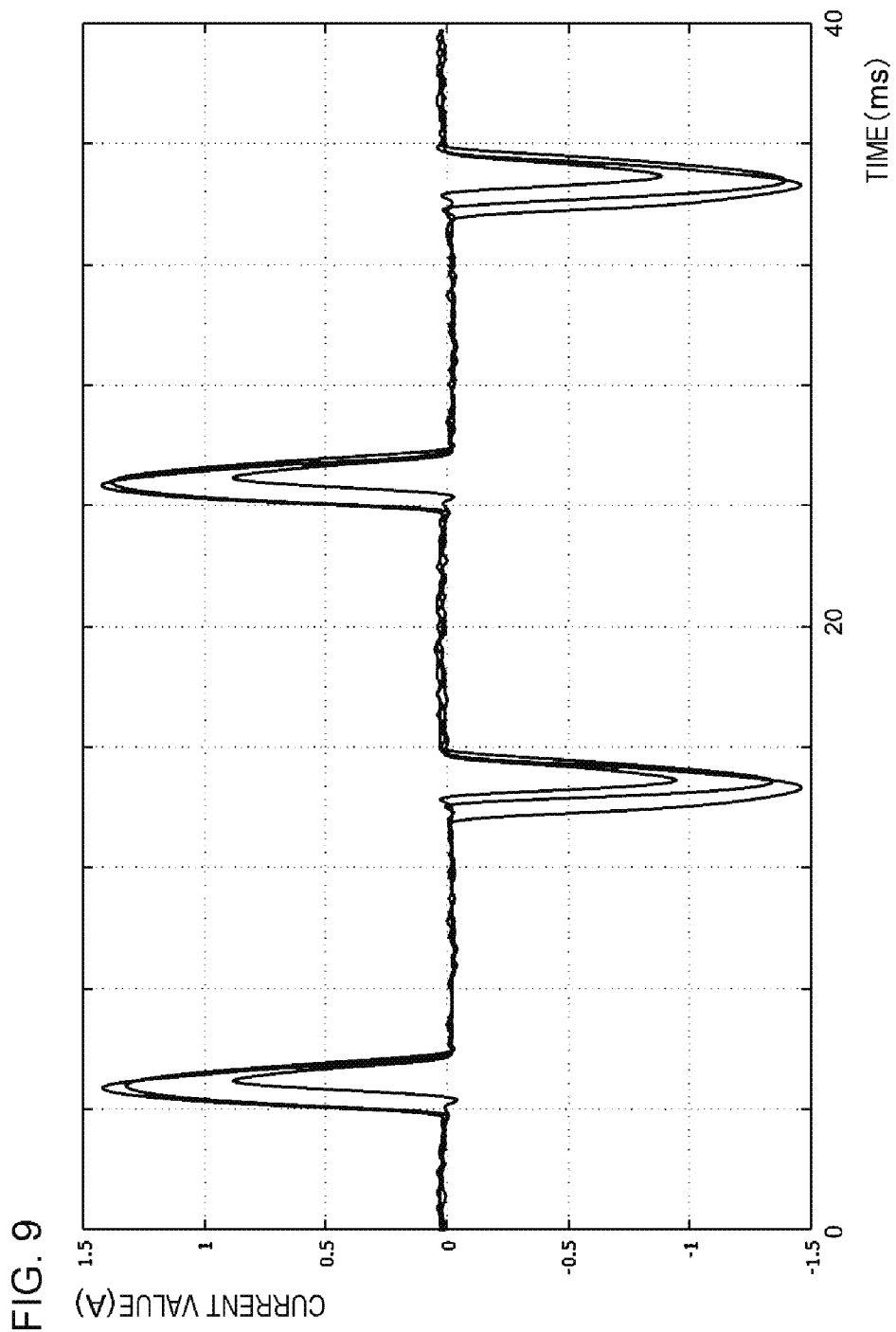
FIG. 9 is a diagram illustrating features of current waveforms related to fluctuation.

FIG. 9 is a diagram in which pieces of measurement data (current waveforms) having different amounts of power which are measured during the occurrence of the fluctuation are plotted in an overlapping manner under the same operational status. That is, FIG. 9 is a diagram in which pieces of measurement data (current waveforms) having different amounts of power belonging to the same operational status group are plotted in an overlapping manner. The inventors find out that when the adjustment of a phase (adjustment of a deviation in a time axis direction) and the adjustment of an amplitude (correction for aligning an amplitude by enlarging or reducing a waveform) are performed on these three current waveforms, the three current waveforms conform to each other. Thus, focusing on the current waveforms, it is possible to extract features of a fluctuation component common to all of the pieces of measurement data of the fluctuation-occurring group.

That is, when a fluctuation component is set to be a current waveform, it is possible to extract a feature value common to all of the pieces of measurement data of the fluctuation-occurring group, for each operational status group. On the other hand, in a case where a current, power, or the like fluctuating depending on the state (for example, the usage rate of a CPU, or the like) of the fluctuation is adopted as a fluctuation component, it is not possible to extract a feature value common to all of the pieces of measurement data of the fluctuation-occurring group. In this case, features of fluctuation components of the operational status group are covered by plural feature values. Thus, when the fluctuation component is set to be a current waveform, it is possible to reduce the number of pieces of data to be handled (the number of pieces of training data and the like).

Note that, as illustrated in FIG. 9, plural fluctuation components having the same shape of a current waveform but having different amplitudes may be extracted from the measurement data of the fluctuation-occurring group. In this case, an average of the plural fluctuation components may be set to be a representative of the operational status groups. The feature value acquisition unit 30 may acquire a feature value from a representative fluctuation component. In addition, as illustrated in FIG. 9, plural fluctuation components having the same shape of a current waveform but having different phases may be extracted from the measurement data of the fluctuation-occurring group. In this case, correction for aligning the phases may be performed before the averaging is performed.

For example, a representative fluctuation component may be decided from the plural fluctuation components for each operational status group by using the following method.

First, a feature value $f_{i,j}$ of a fluctuation component (current waveform) (j denotes an id of the fluctuation component, and i denotes an id of a feature value extracted from the fluctuation component) is normalized by using a certain reference value $C(f_j)$ as expressed by Expression (2). Any value may be used as the reference value for the normalization as long as the value is a reference value such as power consumption, a maximum value or minimum value of a current waveform, an integrated value of the current waveform, or an effective value.

$$f_{i,j} \rightarrow f'_{i,j} = \frac{f_{i,j}}{C(f_j)} \qquad (2)$$

After the normalization is performed, a weighted average is obtained by increasing a weight value of a current waveform having a small value of noise $N(f_j)$ and reducing a weight value of a fluctuation waveform having large noise. The current waveform obtained in this manner may be set to be a representative fluctuation component.

Note that the phase of a fluctuation component may be shifted in proportion to power or other values for normalization. In this case, first, a weighted average can be obtained after making the phases of respective fluctuation components (current waveforms) conform to each other by using the values for normalization. For example, a weight of the weighted average is set to be a reciprocal of the noise N($f_j$), and thus, a representative fluctuation component $F_i$ is obtained by the following Expression (3).

$$F_i = \frac{\sum_j (f'_{i,j} / N(f_j))}{\sum_j 1/N(f_j)} \qquad (3)$$

The weight value used herein may be a value as in Expression (2), or may be a value obtained by multiplying the value of power n times (n is a real number). In addition, the value may be previously set to have a form of a function by modeling a relationship between the magnitude of power and noise, or the like. The form of the model function used herein may be any form as long as noise can be modelled, such as a form using a physical model or a form using machine learning. The above-described processing is performed for each operational status group, thereby obtaining a fluctuation component peculiar to each operational status group.

Figure 10:
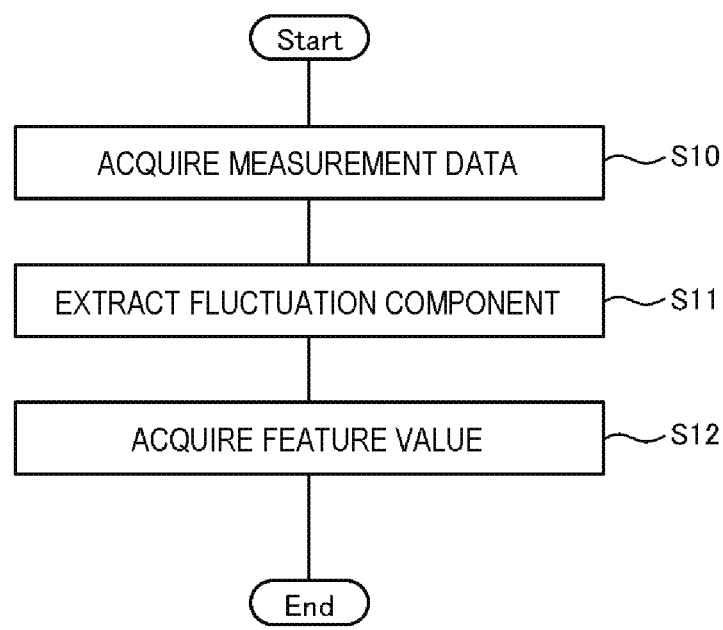
FIG. 10 is a flow chart illustrating an example of a flow of processing of the data processing device according to the exemplary embodiment.

Next, an example of a flow of processing of the data processing device 1 according to this exemplary embodiment will be described with reference to a flow chart of FIG. 10.

First, the measurement data acquisition unit 10 acquires measurement data indicating temporal changes in at least one of current consumption and power consumption of the electrical apparatus (S10). Next, the fluctuation component extraction unit 20 extracts, from the measurement data acquired in S10, a fluctuation component related to fluctuation of the electrical apparatus of which the current consumption and the power consumption may fluctuate (S11). Thereafter, the feature value acquisition unit 30 acquires a feature value of the fluctuation component extracted in S11 (S12).

According to this exemplary embodiment described above, it is possible to extract a feature value related to a fluctuation component of the electrical apparatus from measurement data. It is possible to extract a feature value related to a fluctuation component of the electrical apparatus from measurement data and to accumulate the extracted feature value as training data by using the method according to this exemplary embodiment. In addition, it is possible to extract a feature value related to a fluctuation component of the electrical apparatus from measurement data and then to infer an operational status of the electrical apparatus on the basis of the feature value and training data by using the method according to this exemplary embodiment.

In the invention disclosed in Patent Document 1, an operational status of the electrical apparatus is inferred without considering whether or not the fluctuation has occurred. That is, the accumulation of training data and the inference of an operational status of the electrical apparatus are performed by equally handling pieces of measurement data acquired in a state where the fluctuation occurs and a state where the fluctuation does not occur without distinguishing between the states. In a case of the means, the accuracy of inference of the operational status of the electrical apparatus deteriorates when there is no sufficient amount of training data. For example, in a case where a feature value during the nonoccurrence of the fluctuation is held as training data of an electrical apparatus A, when a component of the fluctuation is included in measurement data at the time of an inference process, it is of course not possible to accurately infer an operational status of the electrical apparatus A. Note that the same situation may occur also in a case where a feature value during the occurrence of the fluctuation is held as training data of the electrical apparatus A and the fluctuation component is not included in the measurement data.

According to the data processing device 1 of this exemplary embodiment which is capable of acquiring a feature value of a fluctuation component related to the fluctuation, it is possible to perform the accumulation of training data and the inference of an operational status of an electrical apparatus by distinguishing between a state where the fluctuation occurs and a state where the fluctuation does not occur. As a result, it is possible to improve the accuracy of inference of an operational status of the electrical apparatus by using a small amount of training data, as compared to the means of Patent Document 1 described above.

In addition, as described above, current consumption or power consumption may fluctuate during the occurrence of the fluctuation, but the shape of a current waveform is fixed. In a case of this exemplary embodiment in which a feature value of such a current waveform can be acquired as a feature value of a fluctuation component, it is possible to reduce the number of pieces of data to be handled (the number of pieces of training data accumulated corresponding to the fluctuation component, the number of feature values extracted during an inference process, and the like). As a result, it is possible to reduce a processing load or a capacity load of a computer.

Modification Example

In the above-described example, the division unit 21 divides measurement data into groups for respective operational statuses (operational status groups) on the basis of, for example, the above-described Expression (1), and then divides the measurement data into a fluctuation-occurring group and a non-fluctuation-occurring group for each operational status group. As a modification example, a process of performing division into groups according to each operational status may not be performed.

In this case, the division unit 21 can set measurement data included in a range between equal to or greater than (peak value $P_k-\gamma_1$) and equal to or less than (peak value $P_k+Y_2$) to be a non-fluctuation-occurring group, and can classify the other pieces of data as a fluctuation-occurring group. The subtraction unit 23 extracts a fluctuation component by subtracting a reference component, extracted from the measurement data (measurement data of the non-fluctuation-occurring group) which is included in the range between equal to or greater than (peak value $P_k-\gamma_1$) and equal to or less than (peak value $P_k+\gamma_2$), from a predetermined component of measurement data (measurement data of the fluctuation-occurring group) in a range between greater than (peak value $P_k+\gamma_2$) and equal to or less than (peak value $P_{k+1}-\gamma_1$).

For example, when there are plural operational statuses such as the usage rate of a CPU in a predetermined electrical apparatus and a case where plural electrical apparatuses are used, a fluctuation component is different for each operational status. That is, when operational contents (contents of processing being performed) obtained by division into groups are different from each other, fluctuation components in groups of the respective operational contents are also different from each other. Thus, division into group is performed for each operational status to extract a fluctuation component, and thus it is possible to clarify to which operational content each fluctuation component for each group corresponds.

Second Exemplary Embodiment

A method of extracting a fluctuation component in a data processing device 1 according to this exemplary embodiment is different from that in the first exemplary embodiment. Other configurations are the same as those in the first exemplary embodiment.

A functional block diagram of the data processing device 1 according to this exemplary embodiment is illustrated in FIG. 2, similar to the first exemplary embodiment. A configuration of a measurement data acquisition unit 10 is the same as that in the first exemplary embodiment.

A fluctuation component extraction unit 20 extracts a difference between a pair of pieces of measurement data measured at different timings as a fluctuation component. A feature value acquisition unit 30 acquires a feature value from the difference (fluctuation component).

For example, the fluctuation component extraction unit 20 sets measurement data for a predetermined period of time to be an object to be processed, to thereby obtain a difference for any pair of pieces of measurement data measured at different timings. For example, the fluctuation component extraction unit 20 may set pieces of measurement data preceding and succeeding on a time axis to be a pair to obtain a difference for each pair. In this exemplary embodiment, the fluctuation component extraction unit 20 obtains a difference between current waveforms.

In a case where the pair satisfies the following conditions, a difference obtained from the pair includes a fluctuation component to be extracted.

(1) Two pieces of measurement data are measured under an operational status of the same electrical apparatus (belong to the same operational status group).

(2) The states (for example, the usage rate of a CPU, or the like) of the fluctuation do not conform to each other. That is, there is a difference in current, power, or the like therebetween.

In a case where the condition of (1) is satisfied, the two pieces of measurement data include the same reference component. When a difference between such a pair of pieces of data is obtained, it is possible to remove the reference component.

As described above in the first exemplary embodiment, current waveforms having the same shape but having different phases or amplitudes are obtained from pieces of measurement data (measurement data belonging to the same operational status group) which are measured under an operational status of the same electrical apparatus, as a current waveform related to the fluctuation. In a case where the condition of (2) is satisfied, that is, in a case where amplitudes are different from each other, current waveforms having different amplitudes and phases, as a difference between the current waveforms, and having the same shape appear. This current waveform can be considered to be a current waveform obtained by multiplying an amplitude of a fluctuation component of the current waveform by a constant and shifting the phase thereof, and thus the shape thereof conforms to that of the fluctuation component.

Thus, it is possible to extract a fluctuation component related to the fluctuation by obtaining a difference between the pair of pieces of data satisfying a predetermined condition.

Here, a processing example of the fluctuation component extraction unit 20 will be specifically described. The fluctuation component extraction unit 20 sets pieces of measurement data for a predetermined period of time (for example, for one hour) to be objects to be processed. The fluctuation component extraction unit 20 sets, for example, pieces of measurement data preceding and succeeding on a time axis to be a pair, to thereby obtain a difference (difference between current waveforms) for each pair. Thereby, time-series data of the difference between the current waveforms is obtained.

Thereafter, the fluctuation component extraction unit 20 divides time-series data of the difference between the current waveforms into any groups. For example, the time-series data may be sectioned for each predetermined time (for example, every 10 minutes) to be grouped.

Subsequently, the fluctuation component extraction unit 20 discriminates whether or not time-series data of a difference belonging to each group satisfies a predetermined condition, and extracts a group satisfying the condition. The processing is performed for the purpose of removing a group including a difference between a pair of pieces of data that does not satisfy the condition of (1) mentioned above, that is, a difference between pieces of data (pieces of data belonging to different operational status groups) which are measured under operational statuses of different electrical apparatuses. The difference between the pair of pieces of data that does not satisfy the condition of (1) mentioned above also includes a difference between reference components in each operational status. Such a difference between the reference components is a noise component in this exemplary embodiment aimed at extracting a fluctuation component. Thus, in the processing, a group including such a noise component is removed, and only a group that does not include such a noise component is extracted.

The fluctuation component extraction unit 20 may determine a variation of differences, for example, for each group. A group having a variation less than a predetermined value may be extracted as a group that satisfies a predetermined condition. In addition, the fluctuation component extraction unit 20 may extract a group including differences, which are similar at a predetermined level or higher, at equal to or more than a predetermined ratio, as a group that satisfies a predetermined condition.

Thereafter, a representative of differences between current waveforms is determined for each group extracted. For example, an average of differences of each group may be set to be a representative of each group. In addition, normalization is performed on all of the differences of each group for each group, and a weighted average may be obtained by increasing a weight value of a difference having a large amplitude (current, power) and decreasing a weight of a difference having a small amplitude. The weighted average may be set to be a representative of each group. As a reference value for the normalization, a maximum value or minimum value of a current waveform (difference), an integrated value of the current waveform (difference), an effective value, or the like may be used. Thus, a fluctuation component (representative) is obtained for each section.

Also in this exemplary embodiment described above, a feature value of a fluctuation component is obtained. As a result, it is possible to realize the same advantageous effects as those in the first exemplary embodiment.

Third Exemplary Embodiment

A data processing device 1 according to this exemplary embodiment is different from the first and second exemplary embodiments in that the data processing device has a function of registering a feature value acquired from a fluctuation component as training data. The other configurations are the same as those in the first and second exemplary embodiments.

Figure 11:
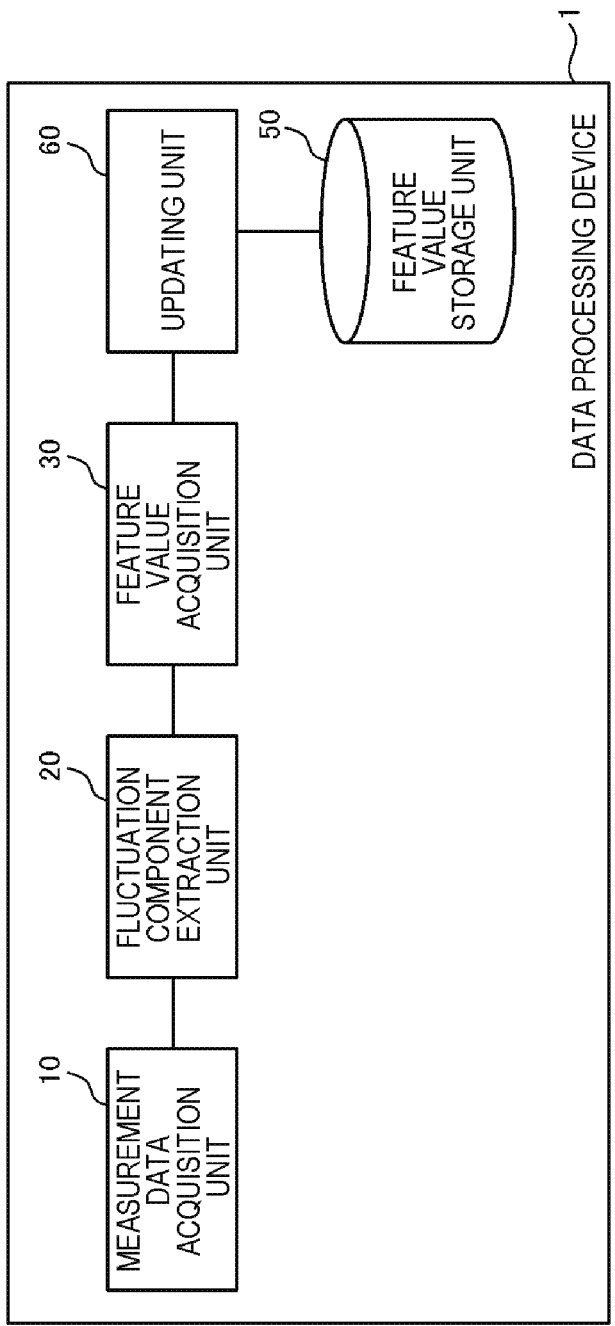
FIG. 11 is an example of a functional block diagram of the data processing device according to the exemplary embodiment.

FIG. 11 illustrates an example of a functional block diagram of the data processing device 1 according to this exemplary embodiment. As illustrated in the drawing, the data processing device 1 includes a measurement data acquisition unit 10, a fluctuation component extraction unit 20, a feature value acquisition unit 30, a feature value storage unit 50, and an updating unit 60. Configurations of the measurement data acquisition unit 10, the fluctuation component extraction unit 20, and the feature value acquisition unit 30 are the same as those in the first and second exemplary embodiments.

Figure 12:
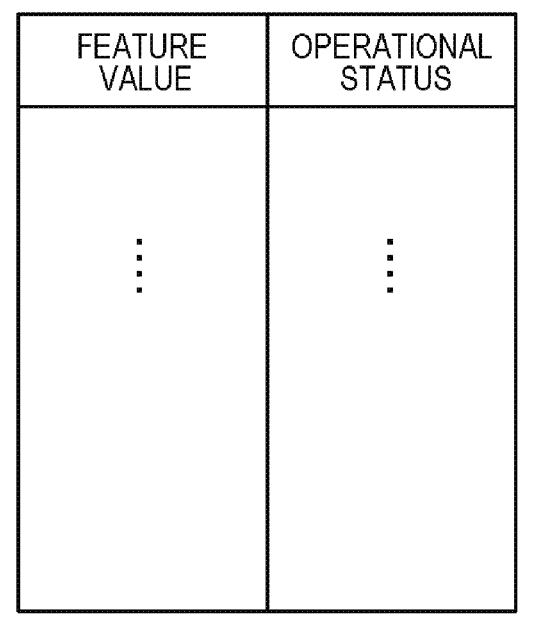

The feature value storage unit 50 stores a feature value of a fluctuation component as training data. As illustrated in FIG. 12, the training data is a pair constituted by a feature value (explanatory variable) of a fluctuation component and an operational status (objective variable) of an electrical apparatus. The operational status of the electrical apparatus is contents for specifying the electrical apparatus being in operation such as "only electrical apparatus A is in operation" or "electrical apparatuses A and B are in operation".

When the feature value acquisition unit 30 acquires a feature value of a fluctuation component, the updating unit 60 determines whether or not the feature value is already stored in the feature value storage unit 50. In a case where the feature value is not stored, the updating unit 60 newly registers the feature value in the feature value storage unit 50. For example, the updating unit 60 obtains differences between objects to be compared (the feature value acquired by the feature value acquisition unit 30 and any feature value stored in the feature value storage unit 50), and may determine that the objects to be compared are the same as each other in a case where a value, such as the sum, the sum of absolute values, an effective value, or the sum of n-th powers (n is a real number) of the differences, is smaller than a predetermined threshold value.

Note that, in a case where the updating unit 60 registers a new feature value in the feature value storage unit 50, the updating unit may receive an input of contents of an operational status of an electrical apparatus corresponding to the feature value from a user at any timing. For example, the updating unit 60 may present a time when a fluctuation component of a feature value to be newly registered appears to the user, and may receive an input for specifying an electrical apparatus being in operation at the time. The updating unit 60 may register the input contents in association with the feature value newly registered.

Figure 13:
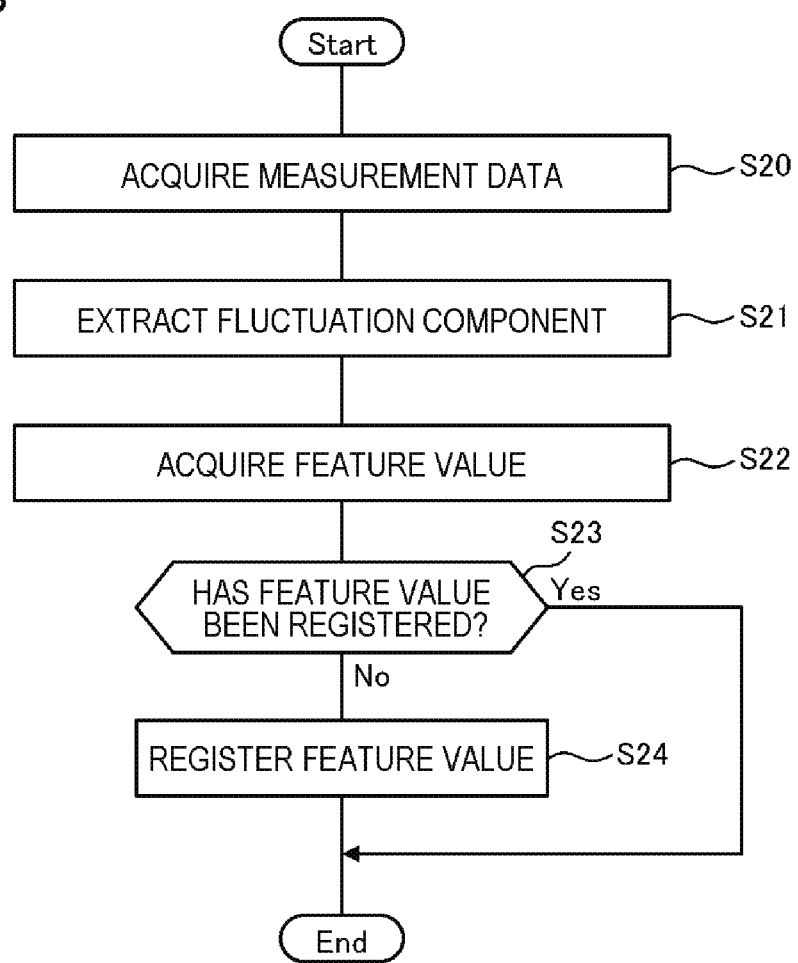
FIG. 13 is a flow chart illustrating an example of a flow of processing of the data processing device according to the exemplary embodiment.

Next, an example of a flow of processing of the data processing device 1 according to this exemplary embodiment will be described with reference to a flow chart of FIG. 13.

First, the measurement data acquisition unit 10 acquires measurement data indicating a temporal change in at least one of current consumption and power consumption of an electrical apparatus (S20). Next, the fluctuation component extraction unit 20 extracts a fluctuation component related to the fluctuation of the electrical apparatus of which the current consumption and the power consumption may fluctuate, from the measurement data acquired in S20 (S21). Thereafter, the feature value acquisition unit 30 acquires a feature value of the fluctuation component extracted in S21 (S22).

Subsequently, the updating unit 60 ascertains whether or not the feature value of the fluctuation component which is acquired in S22 has been already registered in the feature value storage unit 50. In a case where the feature value has not been registered (No in S23), the updating unit 60 newly registers the feature value of the fluctuation component in the feature value storage unit 50 (S24). On the other hand, in a case where the feature value has been registered (Yes in S23), the updating unit 60 terminates the processing without newly registering the feature value of the fluctuation component in the feature value storage unit 50. In addition, here, the registered feature value may be updated, for example, by obtaining an average by using the feature value of the fluctuation component and may be registered in the feature value storage unit 50 again, thereafter terminating the processing.

According to this exemplary embodiment described above, it is possible to accumulate training data (a feature value of a fluctuation component, and the like) for inferring an operational status of an electrical apparatus. In addition, as described in the first exemplary embodiment, in a case where the measurement data acquisition unit 10 acquires measurement data measured in daily life of a power consumer, it is possible to accumulate a feature value of an electrical apparatus which is actually used by each power consumer in the power consumer's facility or a feature value corresponding to a usage pattern (for example, simultaneous use of electrical apparatus A and electrical apparatus B) of the electrical apparatus which is actually performed.

Fourth Exemplary Embodiment

A data processing device 100 according to this exemplary embodiment has a function of inferring an operational status of an electrical apparatus by using the training data accumulated in the third exemplary embodiment.

Figure 14:
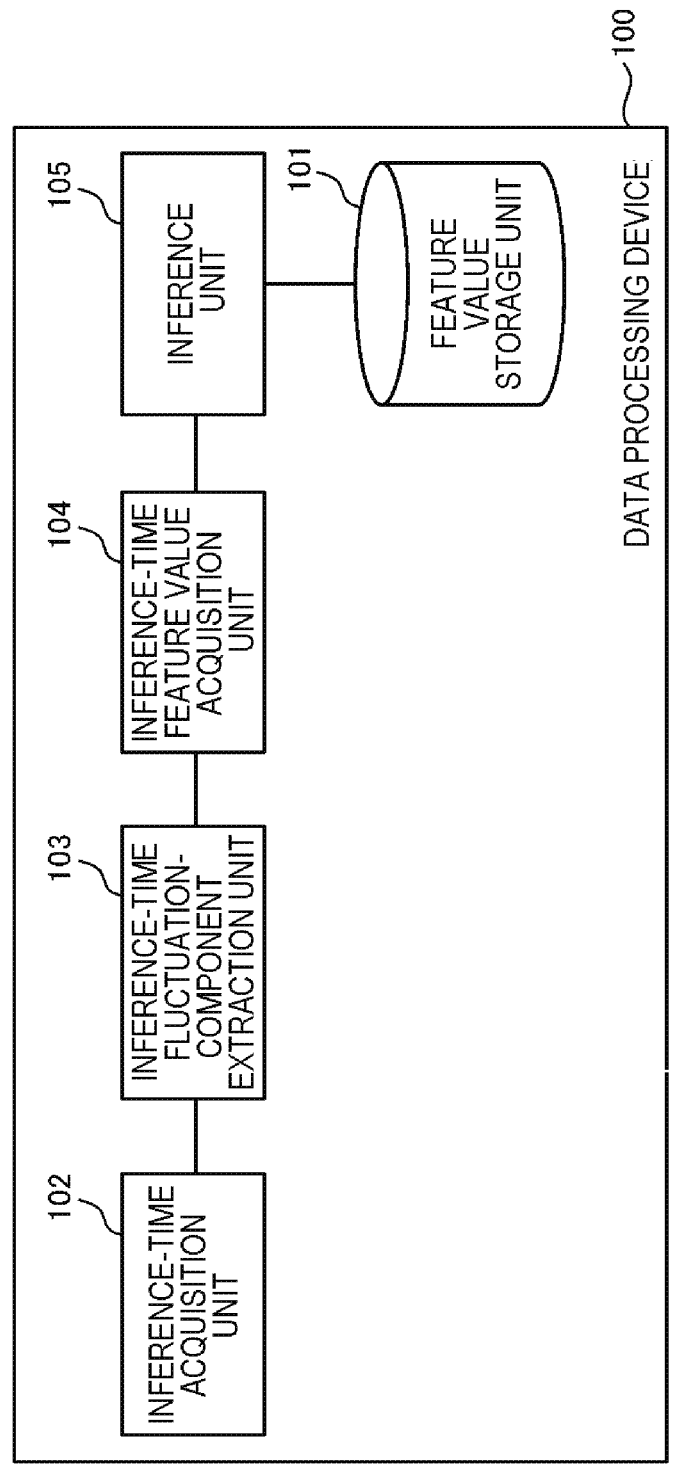
FIG. 14 is an example of a functional block diagram of the data processing device according to the exemplary embodiment.

FIG. 14 illustrates an example of a functional block diagram of the data processing device 100 according to this exemplary embodiment. As illustrated in the drawing, the data processing device 100 includes a feature value storage unit 101, an inference-time acquisition unit 102, an inference-time fluctuation-component extraction unit 103, an inference-time feature value acquisition unit 104, and an inference unit 105.

The feature value storage unit 101 stores a feature value of a fluctuation component related to the fluctuation of an electrical apparatus of which the current consumption and the power consumption may fluctuate, as training data. The feature value storage unit 101 stores training data registered in the feature value storage unit 50 described in the third exemplary embodiment.

The inference-time acquisition unit 102 acquires measurement data indicating a temporal change in at least one of current consumption and power consumption, at the time of inference. A configuration of the inference-time acquisition unit 102 is the same as the configurations of the measurement data acquisition units 10 described in the first to third exemplary embodiments.

The inference-time fluctuation-component extraction unit 103 extracts a fluctuation component from the measurement data acquired by the inference-time acquisition unit 102, at the time of inference. A configuration of the inference-time fluctuation-component extraction unit 103 is the same as the configurations of the fluctuation component extraction units 20 described in the first to third exemplary embodiments. For example, the inference-time fluctuation-component extraction unit 103 sets pieces of measurement data between a period of time from a predetermined time prior to the present point in time to the present point in time to be objects to be processed, and performs division into groups (operational status groups) based on an operational status of an electrical apparatus and division into groups based on whether or not the fluctuation has occurred, by using the same method as in the first to third exemplary embodiments. As a result, data as illustrated in FIG. 8 is obtained. Thereafter, the inference-time fluctuation-component extraction unit 103 extracts a fluctuation component of an operational status group to which measurement data at the present point in time belongs.

The inference-time feature value acquisition unit 104 acquires a feature value of the fluctuation component extracted by the inference-time fluctuation-component extraction unit 103, at the time of inference. A configuration of the inference-time feature value acquisition unit 104 is the same as those of the feature value acquisition units 30 described in the first to third exemplary embodiments.

The inference unit 105 infers an operational status of the electrical apparatus on the basis of the training data stored in the feature value storage unit 101 and the feature value of the fluctuation component which is acquired by the inference-time feature value acquisition unit 104. Specific means for inference performed by the inference unit 105 is not particularly limited, and any method can be adopted. For example, machine learning such as a neural network may be used.

Thereafter, the data processing device 100 may display an inference result obtained by the inference unit 105 through an output device such as a display. For example, information such as "electrical apparatuses being in operation at present are electrical apparatus A and electrical apparatus B." may be displayed. A user can easily recognize an electrical apparatus being in operation with reference to the information. Effort toward power saving, such as the stop of useless operation of an electrical apparatus, is expected.

Figure 15:
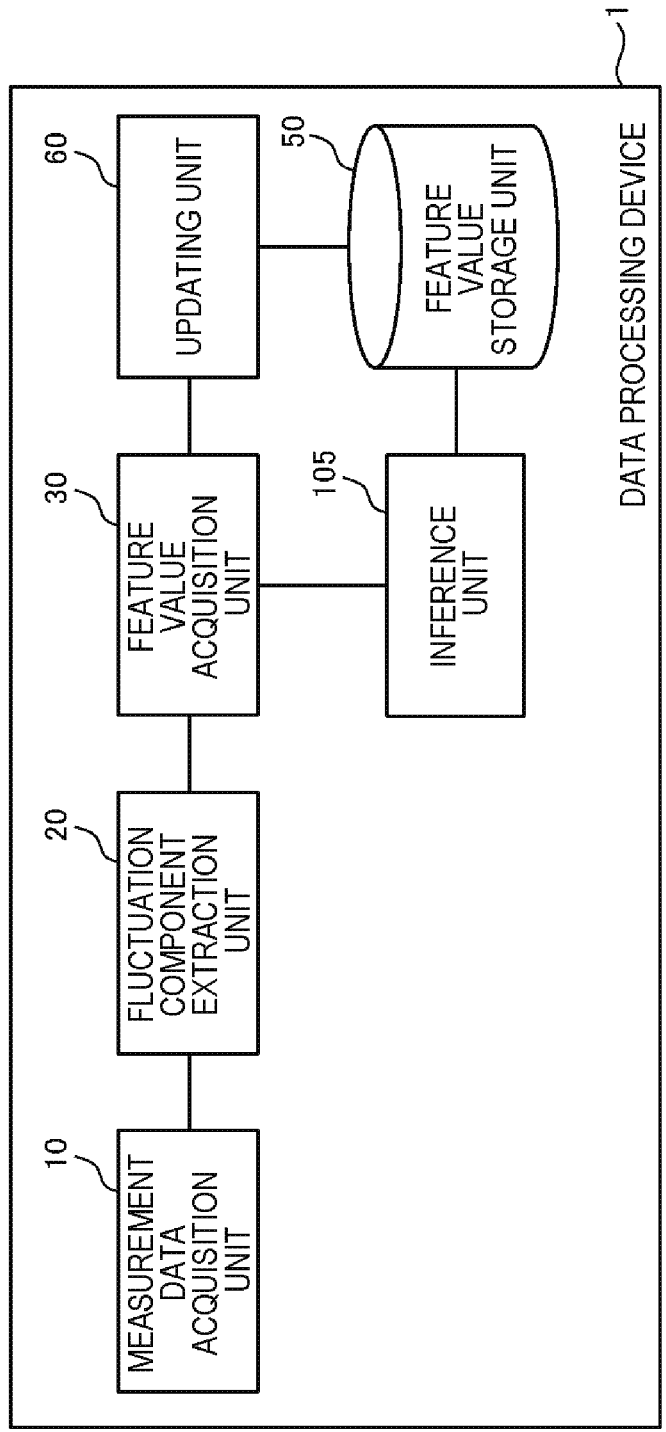
FIG. 15 is an example of a functional block diagram of the data processing device according to the exemplary embodiment.

Note that a configuration as illustrated in FIG. 15 can also be adopted as a modification example of this exemplary embodiment. Configurations of a measurement data acquisition unit 10, a fluctuation component extraction unit 20, a feature value acquisition unit 30, a feature value storage unit 50, and an updating unit 60 are as described in the first to third exemplary embodiments. The inference unit 105 infers an operational status of an electrical apparatus on the basis of the feature value of the fluctuation component which is acquired by the feature value acquisition unit 30 and the training data stored in the feature value storage unit 50. In a case of the modification example, measurement data acquired by the measurement data acquisition unit 10 can be used in both a process of accumulating training data and a process of inferring an operational status of an electrical apparatus.

According to this exemplary embodiment described above, it is possible to infer an operational status of an electrical apparatus by using a feature value of a fluctuation component. In the invention disclosed in Patent Document 1, an operational status of an electrical apparatus is inferred without considering the fluctuation. Thus, in a case where a feature value during the nonoccurrence of the fluctuation is held as training data of an electrical apparatus A, when a component of the fluctuation is included in measurement data at the time of an inference process, it is of course not possible to accurately infer an operational status of the electrical apparatus A. Note that the same situation may occur also in a case where a feature value during the occurrence of the fluctuation is held as training data of the electrical apparatus A.

According to this exemplary embodiment in which a fluctuation component is extracted from measurement data, and an operational status of an electrical apparatus is inferred on the basis of a feature value of the fluctuation component, it is possible to reduce the above-described disadvantage.

In addition, for example, when there are plural operational statuses such as the usage rate of a CPU in a predetermined electrical apparatus and a case where plural of electrical apparatuses are used, a fluctuation component is different for each operational status. That is, when operational contents (contents of processing being performed) obtained by division into groups are different from each other, fluctuation components in groups of the respective operational contents are also different from each other. Thus, division into group is performed for each operational status to extract a fluctuation component, and thus it is possible to clarify to which operational content each fluctuation component for each group corresponds.

Hereinafter, an example of a reference configuration will be appended.

1. A data processing device including:
a measurement data acquisition unit that acquires measurement data indicating a temporal change in at least one of current consumption and power consumption of an electrical apparatus;
a fluctuation component extraction unit that extracts a fluctuation component related to fluctuation in the current consumption and a fluctuation component related to fluctuation in the power consumption from the measurement data; and
a feature value acquisition unit that acquires a feature value of the fluctuation component.

2. The data processing device according to 1,
wherein the fluctuation component extraction unit includes
a reference component extraction unit that extracts a reference component from the measurement data, and
a subtraction unit that subtracts the reference component from a predetermined component of the measurement data to extract the fluctuation component.

3. The data processing device according to 2,
wherein the fluctuation component extraction unit includes a division unit that extracts the reference component on the basis of frequency of appearance of each value in the measurement data.

4. The data processing device according to 2,
wherein the fluctuation component extraction unit includes a division unit that extracts the reference component on the basis of a width of a curve including a peak appearing in data indicating the frequency of appearance of each value in the measurement data.

5. The data processing device according to 1,
wherein the fluctuation component extraction unit includes
a division unit that divides the measurement data into a fluctuation-occurring group and a non-fluctuation-occurring group, on the basis of the frequency of appearance of each value,
a reference component extraction unit that extracts a predetermined component of the measurement data of the non-fluctuation-occurring group as a reference component, and
a subtraction unit that subtracts the reference component from the predetermined component of the measurement data of the fluctuation-occurring group to extract the fluctuation component.

6. The data processing device according to 1,
wherein the fluctuation component extraction unit extracts a difference between the pieces of measurement data at different timings as the fluctuation component.

7. The data processing device according to anyone of 1 to 6,
wherein the fluctuation component extraction unit extracts a current waveform as the fluctuation component.

8. The data processing device according to 7,
wherein the feature value acquisition unit extracts a feature value of a shape of the current waveform.

9. The data processing device according to anyone of 1 to 8, further including:
a feature value storage unit that stores the feature value of the fluctuation component; and
an updating unit that newly stores, in a case where the feature value of the fluctuation component acquired by the feature value acquisition unit is not stored in the feature value storage unit, the feature value of the fluctuation component in the feature value storage unit.

10. A data processing device including:
a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus; and
an inference unit that infers an operational status of the electrical apparatus on the basis of the training data.

11. A data processing method executed by a computer, the method including:
a measurement data acquisition step of acquiring measurement data indicating a temporal change in at least one of current consumption and power consumption of an electrical apparatus;
a fluctuation component extraction step of extracting a fluctuation component related to fluctuation in the current consumption and a fluctuation component related to fluctuation in the power consumption from the measurement data; and
a feature value acquisition step of acquiring a feature value of the fluctuation component.

11-2. The data processing method according to 11,
wherein the fluctuation component extraction step includes
a reference component extraction step of extracting a reference component from the measurement data, and
a subtraction step of subtracting the reference component from a predetermined component of the measurement data to extract the fluctuation component.

11-3. The data processing method according to 11-2,
wherein the fluctuation component extraction step includes a division step of extracting the reference component on the basis of frequency of appearance of each value in the measurement data.

11-4. The data processing method according to 11-2,
wherein the fluctuation component extraction step includes a division step of extracting the reference component on the basis of a width of a curve including a peak appearing in data indicating the frequency of appearance of each value in the measurement data.

11-5. The data processing method according to 11,
wherein the fluctuation component extraction step includes
a division step of dividing the measurement data into a fluctuation-occurring group and a non-fluctuation-occurring group, on the basis of the frequency of appearance of each value,
a reference component extraction step of extracting a predetermined component of the measurement data of the non-fluctuation-occurring group as a reference component, and
a subtraction step of subtracting the reference component from the predetermined component of the measurement data of the fluctuation-occurring group to extract the fluctuation component.

11-6. The data processing method according to 11,
wherein the fluctuation component extraction step includes extracting a difference between the pieces of measurement data at different timings as the fluctuation component.

11-7. The data processing method according to any one of 11 to 11-6,
wherein the fluctuation component extraction step includes extracting a current waveform as the fluctuation component.

11-8. The data processing method according to 11-7,
wherein the feature value acquisition step includes extracting a feature value of a shape of the current waveform.

11-9. The data processing method executed by the computer according to any one of 11 to 11-8, the computer storing in advance the feature value of the fluctuation component, the method further including:
an updating step of newly storing, in a case where the feature value of the fluctuation component acquired in the feature value acquisition step is not stored, the feature value of the fluctuation component.

12. A data processing method executed by a computer storing in advance a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, the method including:
an inference step of inferring an operational status of the electrical apparatus on the basis of the training data.

13. A program causing a computer to function as:
a measurement data acquisition unit that acquires measurement data indicating a temporal change in at least one of current consumption and power consumption of an electrical apparatus;
a fluctuation component extraction unit that extracts a fluctuation component related to fluctuation in the current consumption and a fluctuation component related to fluctuation in the power consumption from the measurement data; and
a feature value acquisition unit that acquires a feature value of the fluctuation component.

13-2. The program according to 13, causing the fluctuation component extraction unit to function as
a reference component extraction unit that extracts a reference component from the measurement data, and
a subtraction unit that subtracts the reference component from a predetermined component of the measurement data to extract the fluctuation component.

13-3. The program according to 13-2, causing the fluctuation component extraction unit to function as a division unit that extracts the reference component on the basis of frequency of appearance of each value in the measurement data.

13-4. The program according to 13-2, causing the fluctuation component extraction unit to function as a division unit that extracts the reference component on the basis of a width of a curve including a peak appearing in data indicating the frequency of appearance of each value in the measurement data.

13-5. The program according to 13, causing the fluctuation component extraction unit to function as
a division unit that divides the measurement data into a fluctuation-occurring group and a non-fluctuation-occurring group, on the basis of the frequency of appearance of each value,
a reference component extraction unit that extracts a predetermined component of the measurement data of the non-fluctuation-occurring group as a reference component, and
a subtraction unit that subtracts the reference component from the predetermined component of the measurement data of the fluctuation-occurring group to extract the fluctuation component.

13-6. The program according to 13, causing the fluctuation component extraction unit to extract a difference between the pieces of measurement data at different timings as the fluctuation component.

13-7. The program according to any one of 13 to 13-6, causing the fluctuation component extraction unit to extract a current waveform as the fluctuation component.

13-8. The program according to 13-7, causing the feature value acquisition unit to extract a feature value of a shape of the current waveform.

13-9. The program according to any one of 13 to 13-8, causing the computer to further function as:
a feature value storage unit that stores the feature value of the fluctuation component; and
an updating unit that newly stores, in a case where the feature value of the fluctuation component acquired by the feature value acquisition unit is not stored in the feature value storage unit, the feature value of the fluctuation component in the feature value storage unit.

14. A program causing a computer to function as:
a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus; and
an inference unit that infers an operational status of the electrical apparatus on the basis of the training data.

15-1. A data processing device including:
a measurement data acquisition unit that acquires measurement data indicating a temporal change in at least one of current consumption and power consumption of an electrical apparatus;
a fluctuation component extraction unit that extracts, from the measurement data, a fluctuation component related to fluctuation in current consumption and a fluctuation component related to fluctuation in power consumption of the electrical apparatus of which the current consumption and the power consumption may fluctuate during operation of the electrical apparatus; and
a feature value acquisition unit that acquires a feature value of the fluctuation component.

15-2. The data processing device according to 15-1,
wherein the fluctuation component extraction unit includes
a division unit that divides the measurement data into a fluctuation-occurring group and a non-fluctuation-occurring group, on the basis of frequency of appearance of a value,
a reference component extraction unit that extracts a component of the measurement data of the non-fluctuation-occurring group as a reference component, and a subtraction unit that subtracts the reference component from the component of the measurement data of the fluctuation-occurring group to extract the fluctuation component.

15-3. The data processing device according to 15-1, wherein the fluctuation component extraction unit extracts a difference between the pieces of measurement data at different timings as the fluctuation component.

15-4. The data processing device according to any one of 15-1 to 15-3, wherein the fluctuation component extraction unit extracts a current waveform as the fluctuation component.

15-5. The data processing device according to 15-4, wherein the feature value acquisition unit extracts a feature value of a shape of the current waveform.

15-6. The data processing device according to any one of 15-1 to 15-5, further including:
a feature value storage unit that stores the feature value of the fluctuation component; and
an updating unit that newly stores, in a case where the feature value of the fluctuation component acquired by the feature value acquisition unit is not stored in the feature value storage unit, the feature value of the fluctuation component in the feature value storage unit.

15-7. A data processing device including:
a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus;
an inference-time acquisition unit that acquires measurement data indicating a temporal change in at least one of current consumption and power consumption;
an inference-time fluctuation-component extraction unit that extracts the fluctuation component from the measurement data acquired by the inference-time acquisition unit;
an inference-time feature value acquisition unit that acquires a feature value of the fluctuation component extracted by the inference-time fluctuation-component extraction unit; and
an inference unit that infers an operational status the electrical apparatus on the basis of the training data and the feature value of the fluctuation component which is acquired by the inference-time feature value acquisition unit.

15-8. A data processing method executed by a computer, the method including:
a measurement data acquisition step of acquiring measurement data indicating a temporal change in at least one of current consumption and power consumption of an electrical apparatus;
a fluctuation component extraction step of extracting, from the measurement data, a fluctuation component related to fluctuation in current consumption and a fluctuation component related to fluctuation in power consumption of the electrical apparatus of which the current consumption and the power consumption may fluctuate during operation of the electrical apparatus; and
a feature value acquisition step of acquiring a feature value of the fluctuation component.

15-9. A program causing a computer to function as:
a measurement data acquisition unit that acquires measurement data indicating a temporal change in at least one of current consumption and power consumption of an electrical apparatus;

a fluctuation component extraction unit that extracts, from the measurement data, a fluctuation component related to fluctuation in current consumption and a fluctuation component related to fluctuation in power consumption of the electrical apparatus of which the current consumption and the power consumption may fluctuate during operation of the electrical apparatus; and
a feature value acquisition unit that acquires a feature value of the fluctuation component.

15-10. A data processing method executed by a computer storing in advance a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, the method including:
an inference-time acquisition step of acquiring measurement data indicating a temporal change in at least one of the current consumption and the power consumption;
an inference-time fluctuation-component extraction step of extracting the fluctuation component from the measurement data acquired in the inference-time acquisition step;
an inference-time feature value acquisition step of acquiring a feature value of the fluctuation component extracted in the inference-time fluctuation-component extraction step; and
an inference step of inferring an operational status of the electrical apparatus on the basis of the training data and the feature value of the fluctuation component which is acquired in the inference-time feature value acquisition step.

15-11. A program causing a computer to function as:
a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus; and
an inference-time acquisition unit that acquires measurement data indicating a temporal change in at least one of the current consumption and the power consumption;
an inference-time fluctuation-component extraction unit that extracts the fluctuation component from the measurement data acquired by the inference-time acquisition unit;
an inference-time feature value acquisition unit that acquires a feature value of the fluctuation component extracted by the inference-time fluctuation-component extraction unit; and
an inference unit that infers an operational status the electrical apparatus on the basis of the training data and the feature value of the fluctuation component which is acquired by the inference-time feature value acquisition unit.

The application is based on Japanese Patent Application No. 2015-071069 filed on Mar. 31, 2015, the content of which is incorporated herein by reference.

The invention claimed is:
1. A data processing device comprising:
a measurement data acquisition unit that acquires measurement data indicating a temporal change in at least one of current consumption and power consumption of an electrical apparatus;
a fluctuation component extraction unit that extracts a fluctuation component related to fluctuation in the current consumption and a fluctuation component related to fluctuation in the power consumption from the measurement data; and a feature value acquisition unit that acquires a feature value of the fluctuation component, wherein the fluctuation component extraction unit further comprises:

a reference component extraction unit that extracts a reference component from the measurement data, a subtraction unit that subtracts the reference component from a predetermined component of the measurement data to extract the fluctuation component, and a division unit that extracts the reference component on the basis of frequency of appearance of each value in the measurement data.

2. The data processing device according to claim 1, wherein the division unit extracts the reference component on the basis of a width of a curve including a peak appearing in data indicating the frequency of appearance of each value in the measurement data.

3. The data processing device according to claim 1, wherein the fluctuation component extraction unit further comprises:

the division unit that divides the measurement data into a fluctuation-occurring group and a non-fluctuation-occurring group, on the basis of the frequency of appearance of each value, the reference component extraction unit that extracts a predetermined component of the measurement data of the non-fluctuation-occurring group as a reference component, and the subtraction unit that subtracts the reference component from the predetermined component of the measurement data of the fluctuation-occurring group to extract the fluctuation component.

4. The data processing device according to claim 1, wherein the fluctuation component extraction unit extracts a current waveform as the fluctuation component.

5. The data processing device according to claim 4, wherein the feature value acquisition unit extracts a feature value of a shape of the current waveform.

6. The data processing device according to claim 1, further comprising:

a feature value storage unit that stores the feature value of the fluctuation component; and an updating unit that newly stores, in a case where the feature value of the fluctuation component acquired by the feature value acquisition unit is not stored in the feature value storage unit, the feature value of the fluctuation component in the feature value storage unit.

7. A data processing device comprising:

a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus; and an inference unit that infers an operational status of the electrical apparatus on the basis of the training data, wherein the fluctuation component is data extracted by subtracting a reference component extracted from measurement data on the basis of frequency of appearance from a predetermined component of the measurement data.

8. A data processing method executed by a computer, the method comprising:

a measurement data acquisition step of acquiring measurement data indicating a temporal change in at least one of current consumption and power consumption of an electrical apparatus;

a fluctuation component extraction step of extracting a fluctuation component related to fluctuation in the current consumption and a fluctuation component related to fluctuation in the power consumption from the measurement data; and a feature value acquisition step of acquiring a feature value of the fluctuation component, wherein the fluctuation component extraction step further comprises:

a reference component extraction step of extracting a reference component from the measurement data, a subtraction step of subtracting the reference component from a predetermined component of the measurement data to extract the fluctuation component, and a division step of extracting the reference component on the basis of frequency of appearance of each value in the measurement data.

9. A data processing method executed by a computer storing in advance a feature value of a fluctuation component related to fluctuation in current consumption and a feature value of a fluctuation component related to fluctuation in power consumption of an electrical apparatus of which the current consumption and the power consumption may fluctuate during operation of the electrical apparatus, the method comprising:

an inference step of inferring an operational status of the electrical apparatus on the basis of the training data, wherein the fluctuation component is data extracted by subtracting a reference component extracted from measurement data on the basis of frequency of appearance from a predetermined component of the measurement data.

10. A non-transitory computer-readable storage medium storing a program, which when executed by a processor, causes a computer to function as:

a measurement data acquisition unit that acquires measurement data indicating a temporal change in at least one of current consumption and power consumption of an electrical apparatus;

a fluctuation component extraction unit that extracts a fluctuation component related to fluctuation in the current consumption and a fluctuation component related to fluctuation in the power consumption from the measurement data; and a feature value acquisition unit that acquires a feature value of the fluctuation component, wherein the fluctuation component extraction step further comprises:

a reference component extraction step of extracting a reference component from the measurement data, a subtraction unit that subtracts the reference component from a predetermined component of the measurement data to extract the fluctuation component, and a division unit that extracts the reference component on the basis of frequency of appearance of each value in the measurement data.

11. A non-transitory computer-readable storage medium storing a program, which when executed by a processor, causes a computer to function as:

a feature value storage unit that stores, as training data, a feature value of a fluctuation component related to fluctuation in current consumption and a feature value of a fluctuation component related to fluctuation in power consumption of an electrical apparatus of which the current consumption and the power consumption may fluctuate during operation of the electrical apparatus; and an inference unit that infers an operational status of the electrical apparatus on the basis of the training data, wherein the fluctuation component is data extracted by subtracting a reference component extracted from measurement data on the basis of frequency of appearance from a predetermined component of the measurement data.

* * * * *

UNITED STATES PATENT AND TRADEMARK OFFICE
CERTIFICATE OF CORRECTION

PATENT NO. : 10,712,375 B2
APPLICATION NO. : 15/562233
DATED : July 14, 2020
INVENTOR(S) : Takahiro Toizumi et al.

Page 1 of 1

It is certified that error appears in the above-identified patent and that said Letters Patent is hereby corrected as shown below:

In the Specification

Column 13, Description of Exemplary Embodiments, Line 29; Delete "$P_k+Y_2$)" and insert --$P_k+\gamma_2$)-- therefor Column 19, Description of Exemplary Embodiments, Line 61; Delete "anyone" and insert --any one-- therefor Column 20, Description of Exemplary Embodiments, Line 1; Delete "anyone" and insert --any one-- therefor In the Claims Column 26, Line 51; In Claim 10, delete "step" and insert --unit-- therefor Column 26, Line 53; In Claim 10, delete "step of extracting" and insert --unit that extracts-- therefor Signed and Sealed this
Seventeenth Day of November, 2020

Andrei Iancu
*Director of the United States Patent and Trademark Office*